United States Patent
Ayazi et al.

(10) Patent No.: US 9,917,571 B2
(45) Date of Patent: Mar. 13, 2018

(54) RESONANT GYROSCOPES AND METHODS OF MAKING AND USING THE SAME

(71) Applicant: GEORGIA TECH RESEARCH CORPORATION, Atlanta, GA (US)

(72) Inventors: Farrokh Ayazi, Atlanta, GA (US); Roozbeh Tabrizian, Atlanta, GA (US); Mojtaba Hodjat-Shamami, Atlanta, GA (US); Arashk Norouzpour-Shirazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 198 days.

(21) Appl. No.: 14/739,721

(22) Filed: Jun. 15, 2015

(65) Prior Publication Data

US 2017/0038211 A1    Feb. 9, 2017

Related U.S. Application Data

(60) Provisional application No. 62/011,725, filed on Jun. 13, 2014, provisional application No. 62/104,508, filed on Jan. 16, 2015.

(51) Int. Cl.
*H03J 1/06* (2006.01)
*G01C 19/5684* (2012.01)

(52) U.S. Cl.
CPC ............ *H03J 1/06* (2013.01); *G01C 19/5684* (2013.01); *H03J 2200/19* (2013.01)

(58) Field of Classification Search
CPC ...... G01C 19/5684; H03J 1/06; H03J 2200/19
See application file for complete search history.

(56) References Cited

U.S. PATENT DOCUMENTS

| | | | | |
|---|---|---|---|---|
| 4,760,358 A * | 7/1988 | Inoue | ..................... | H03H 9/132 310/366 |
| 5,668,057 A * | 9/1997 | Eda | ......................... | H01L 27/20 257/E27.006 |
| 5,767,405 A * | 6/1998 | Bernstein | ........... | G01C 19/5719 73/504.12 |
| 6,064,142 A * | 5/2000 | Yamamoto | ........... | H03H 9/1028 310/344 |
| 6,909,221 B2 * | 6/2005 | Ayazi | ........................ | H03H 3/02 310/312 |
| 8,450,913 B1 * | 5/2013 | Ayazi | .................. | H03H 9/02409 310/328 |

(Continued)

*Primary Examiner* — Francis Gray
(74) *Attorney, Agent, or Firm* — Burns & Levinson, LLP; Bruce D. Jobse

(57) ABSTRACT

Certain implementations of the disclosed technology may include systems and methods for high-frequency resonant gyroscopes. In an example implementation, a resonator gyroscope assembly is provided. The resonator gyroscope assembly can include a square resonator body suspended adjacent to a substrate, a ground electrode attached to a side of the resonator body, a piezoelectric layer attached to a side of the ground electrode, a drive electrode in electrical communication with the piezoelectric layer, and configured to stimulate one or more vibration modes of the square resonator body; and a sense electrode in electrical communication with the piezoelectric layer, and configured to receive an output from the square or disk resonator responsive to stimulation of the one or more vibration modes.

29 Claims, 15 Drawing Sheets

(56) References Cited

U.S. PATENT DOCUMENTS

| | | | |
|---|---|---|---|
| 2004/0135144 A1* | 7/2004 | Yamada | H03H 9/02094 257/59 |
| 2013/0020279 A1* | 1/2013 | Lee | B81C 1/00476 216/13 |
| 2013/0076209 A1* | 3/2013 | Zuo | H03H 9/02062 310/366 |
| 2014/0090470 A1* | 4/2014 | Fujimoto | G01P 9/04 73/504.12 |

* cited by examiner

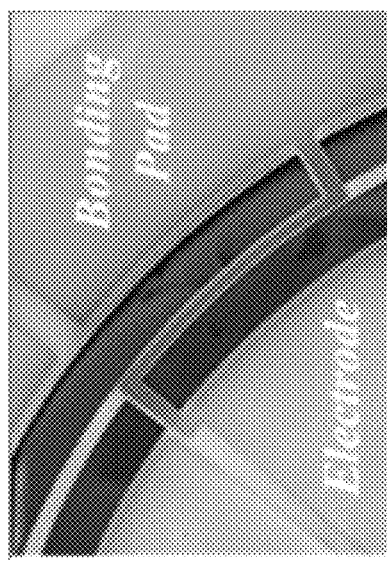
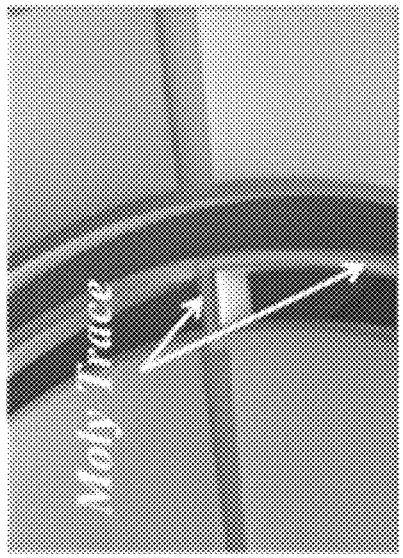
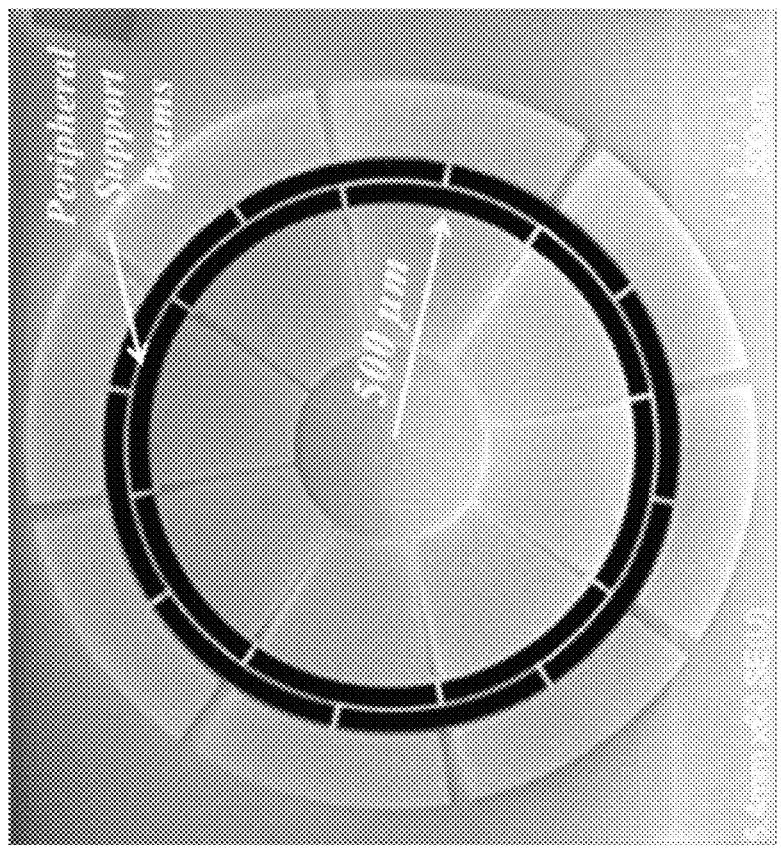
FIG. 9B
FIG. 9C
FIG. 9A

RESONANT GYROSCOPES AND METHODS OF MAKING AND USING THE SAME

CROSS REFERENCE TO RELATED APPLICATIONS

This application claims benefit, under 35 U.S.C. § 119(e), to U.S. Provisional Application No. 62/011,725 filed Jun. 13, 2014, entitled "High-Frequency AlN-on-Silicon Resonant Square Gyroscopes," and to U.S. Provisional Application No. 62/104,508 filed Jan. 16, 2015, entitled "Piezoelectrically Transduced Resonant Disk Gyroscope." The entire contents and substance of those applications are hereby incorporated by reference herein as if fully set forth below.

STATEMENT OF FEDERALLY SPONSORED RESEARCH

This technology was made with government support under contract HR0011-00-C-0032 awarded by the Defense Advanced Research Projects Agency (DARPA). The government has certain rights in the technology.

TECHNICAL FIELD

The various embodiments of the disclosure relate generally to microelectromechanical systems (MEMS), devices, and methods of making the same. More particularly, the embodiments relate to high-frequency resonant gyroscopes, and methods of tuning the same.

BACKGROUND

In recent years, MEMS gyroscopes have been adopted rapidly in a variety of consumer applications due to significant reduction in their size, cost and power consumption. Conventional vibratory rate gyroscopes generally use a pair of low-frequency rigid-body resonance modes in a microstructure for rotation rate detection, by actuating the primary resonance mode of the device and detecting the rate-proportional Coriolis displacement signal along the secondary resonance mode. Although these vibratory gyroscopes provide the degree of functionality required by some consumer applications, they can fail to offer the performance level demanded by many high-end applications, such as short-range inertial navigation, while maintaining a micro-scale physical size.

By taking advantage of the stiff bulk resonance modes of the device structure, high-frequency resonant bulk acoustic wave (BAW) gyroscopes can overcome many limitations of low-frequency gyroscopes, such as vibration sensitivity, susceptibility to mechanical shock, and inadequate bandwidth and dynamic range under mode-matched conditions. In some cases the mechanical rate sensitivity of gyroscopes can decrease at higher resonance frequencies due to the smaller vibration amplitude and the distribution of mass and stiffness of bulk resonance modes over the volume of the device. High-sensitivity capacitive BAW gyroscopes generally utilize submicron air gaps and large DC voltages to provide efficient transduction at high frequencies. They can also require vacuum encapsulation to avoid squeeze-film damping, which in turn necessitates special design considerations for co-integration of capacitive gyroscopes with static accelerometers, where low-pressure requirements for gyroscope packaging conflicts with the desired over-damped performance of the accelerometer needed for fast settling time and small overshoot.

The quest for implementation of BAW gyroscopes that can provide efficient in-air transduction to minimize packaging complexity of multi-degree-of-freedom sensors, without the need for narrow gaps and large DC polarization voltages to further reduce fabrication cost and high voltage requirements of the sensor, has led to the implementation of piezoelectrically-transduced high-frequency resonant gyroscopes. Inherent linearity and high efficiency of the piezoelectric transduction combined with superior power handling of thick single-crystal silicon acoustic platform can facilitate actuation of the piezo-on-silicon gyroscopes with adequate vibration amplitudes, paving the way towards significant enhancement of rotation rate sensitivity and total signal-to-noise ratio. Although the piezoelectric thin film can provide effective transduction and thus large drive amplitude, an efficient frequency tuning mechanism is needed to enable mode matching of all-piezoelectric high-frequency resonant gyroscopes in the presence of process non-idealities. This can be accomplished with a multi-port BAW gyroscope, utilizing a gyroscopic mode pair, with mode matching capability, enabled by a dynamic frequency tuning technique based on electrical feedback of the drive-mode displacement signal.

Further, silicon BAW resonant disk micro-gyroscopes operating in mode-matched condition at high frequencies have recently been considered as a viable miniaturized solution for rotation-rate sensing. Capacitive signal transduction through nano air-gaps has also been considered for BAW silicon disk gyroscopes.

BRIEF SUMMARY

Some or all of the above needs can be addressed by certain implementations of the disclosed technology. The disclosed technology includes systems and methods for high-frequency resonant gyroscopes.

Some aspects of the present disclosure relate to a resonator gyroscope assembly comprising a square resonator body suspended adjacent to a substrate, a ground electrode attached to a side of the resonator body, a piezoelectric layer attached to a side of the ground electrode, a drive electrode in electrical communication with the piezoelectric layer, and configured to stimulate a first vibration mode of the square resonator body, and a sense electrode in electrical communication with the piezoelectric layer, and configured to receive an output from the square resonator body responsive to stimulation of a second vibration mode of the square resonator body.

In some embodiments, the piezoelectric layer is composed of a material selected from the group consisting of AlN, ZnO, PZT, GaN, LiNbO3, and mixtures thereof. In some embodiments, the resonator gyroscope further comprises a tuning electrode in electrical communication with the piezoelectric layer, and configured to match a resonant frequency of the first vibration mode of the resonator body and a resonant frequency of the second vibration mode of the resonator body. In some embodiments, the resonator gyroscope further comprises a tuning electrode in electrical communication with the piezoelectric layer, and configured to minimize a zero rotation rate output voltage. In some embodiments, the first vibration mode and second vibration mode are mutually orthogonal. In some embodiments, the first vibration mode and second vibration mode are degenerate vibration modes. In some embodiments, the first vibration mode and second vibration mode are flexural vibration modes. In some embodiments, the square resonator body is suspended adjacent to the substrate by a suspension support in communication with the substrate. In some embodiments, the suspension supports support a portion of the drive electrode and the sense electrode.

Some aspects of the present disclosure relate to a resonator gyroscope assembly comprising a resonator body suspended adjacent to a substrate, a ground electrode attached to a side of the resonator body, a piezoelectric layer attached to a side of the ground electrode, a drive electrode in electrical communication with the piezoelectric layer, and configured to detect a first vibration mode of the resonator body, a sense electrode in electrical communication with the piezoelectric layer, and configured to receive an output from the resonator body responsive to stimulation of a second vibration mode of the resonator body, and a drive-tuning electrode in electrical communication with the piezoelectric layer, and configured match a resonant frequency of the first vibration mode of the resonator body and a resonant frequency of the second vibration mode of the resonator body.

In some embodiments, the piezoelectric material is composed of a material selected from the group comprising AlN, ZnO, PZT, GaN, LiNbO3, and mixtures thereof. In some embodiments, the resonator body comprises a disk resonator body. In some embodiments, an alternating current signal is applied to the tuning electrode. In some embodiments, the first vibration mode and second vibration mode are mutually orthogonal. In some embodiments, the first vibration mode and second vibration mode are degenerate vibration modes. In some embodiments, the first vibration mode and second vibration mode are flexural vibration modes. In some embodiments, the resonator body is suspended adjacent to the substrate by a suspension support in communication with the substrate. In some embodiments, the resonator body and suspension supports are fabricated from the substrate. In some embodiments, the resonator gyroscope further comprises a linear tuning circuit configured to receive a drive input signal corresponding to the displacement of a drive electrode, produce an output signal corresponding to an integration of the drive input signal multiplied by a scale factor, and apply the output signal to the drive-tuning electrode. In some embodiments, the resonator gyroscope further comprises a lock-in amplifier, having a sense channel, and a drive channel, wherein the sense channel is configured to receive a sense input signal from the sense electrode corresponding to the displacement of the sense electrode, and is configured to output a signal proportional to the rate of rotation of the gyroscope, and wherein the drive channel is configured to receive the drive input signal, and is configured to produce a drive output a signal corresponding to a resonant frequency of the resonator body, and is configured to apply the drive output signal to a drive-stimulating electrode.

Some aspects of the present disclosure relate to method for making a gyroscope resonator comprising patterning a drive electrode and a sense electrode on a first side of the substrate, wherein the substrate comprises a first conductive layer and second conductive layer separated by piezoelectric layer attached to a first semiconductor layer and a second semiconductor layer separated by an insulator layer, and wherein the patterning removes a portion of the first conductive layer, patterning a resonator body by removing a portion of the first conductive layer, piezoelectric layer, second conductive layer, and substrate to define a shape of a resonator, and releasing the resonator body by removing a portion of the second conductor layer and the insulator layer of the substrate disposed approximately adjacent to the resonator body.

In some embodiments, the piezoelectric layer comprises one or more of AlN, ZnO, PZT, GaN, and LiNbO3. In some embodiments, the resonator body is a square resonator body. In some embodiments, the method further comprises the step of patterning a drive-tuning electrode onto the first side of the substrate, wherein the patterning removes a portion of the first conductive layer. In some embodiments, the resonator body is composed of a material selected from a group consisting of fused quartz, polysilicon, silicon oxide, monocrystalline silicon, metallic materials, GaAs, silicon carbide, diamond, and mixtures thereof. In some embodiments, patterning the resonator body further comprises removing a portion of the first conductive layer and the substrate defining a shape of a suspension support in communication with the substrate and the resonator body. In some embodiments, a portion of the an electrode is supported by the suspension supports.

Some aspects of the present disclosure relate to a method of operating a piezoelectric gyroscope, comprising receiving a drive input signal corresponding to a displacement of a drive electrode, generating an output signal corresponding to an integration of the drive input signal multiplied by a scale factor, and applying the output signal to a drive-tuning electrode. In some embodiments, the method further comprises receiving a sense input signal corresponding to a displacement of a sense electrode, generating a rotation rate output signal proportional to a rate of rotation of the gyroscope.

In some embodiments, the method further comprises receiving a drive input signal, generating a drive output signal corresponding to a resonant frequency of a resonator body, and applying the drive output signal to a drive stimulating electrode.

Other implementations, features, and aspects of the disclosed technology are described in detail herein and are considered a part of the claimed disclosed technology. Other implementations, features, and aspects can be understood with reference to the following detailed description, accompanying drawings, and claims.

BRIEF DESCRIPTION OF THE FIGURES

Reference will now be made to the accompanying figures and flow diagrams, which are not necessarily drawn to scale, and wherein:

FIG. 9A is a SEM view of the AlN-on-Si disk gyroscope of FIG. 2, in accordance with some embodiments.

FIG. 9B is an enlarged view of the bonding pad and electrode of the AlN-on-Si disk gyroscope depicted in FIG. 9A.

FIG. 9C is an enlarged view of the Mo trace of the AlN-on-Si disk gyroscope depicted in FIG. 9A.

DETAILED DESCRIPTION

Figure 1:
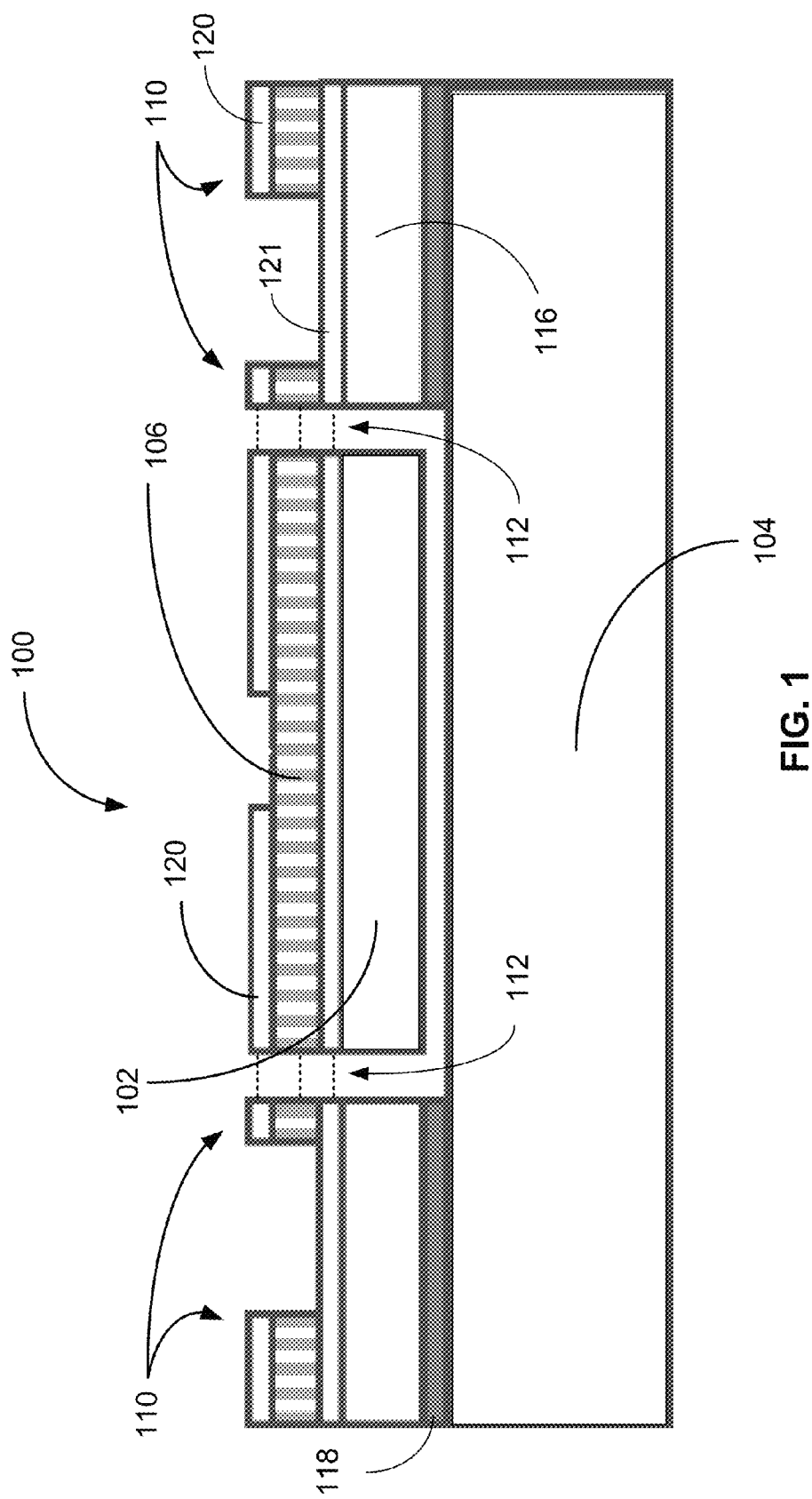
FIG. 1 depicts a side view of a resonant piezoelectric gyroscope device 100, in accordance with some embodiments.

Some embodiments of the disclosed technology provide a resonant gyroscope device, methods of making the device, and methods of tuning the device. In some embodiments, the resonant gyroscope comprises a square resonator. In some embodiments, the resonant gyroscope comprises a disk resonator. In some embodiments, the resonant gyroscope device can be excited and sensed by thin-film piezoelectric transducers deposited on the top surface of the structure. Some embodiments of the resonant square gyroscope device can operate with inherently orthogonal degenerate-mode pairs, which can enable the sensing and excitation, as will be discussed herein.

Some embodiments of the disclosed technology can use an electrode configuration for simultaneous, yet independent, transduction of degenerate-mode pairs, enabling the operation of the silicon resonator as a mode-matched gyroscope. Owing to highly efficient and linear piezoelectric transduction, such high-frequency and high-Q gyroscopes can potentially offer very large dynamic range by simultaneously improving the full-scale linear range while reducing the noise-equivalent rotation rate. In some embodiments, the dynamic range of the device can be approximately $10^5$. In other example implementations, the dynamic range of the device can be approximately $10^6$, or even greater.

Although preferred embodiments of the disclosed technology are explained in detail, it is to be understood that other embodiments are contemplated. Accordingly, it is not intended that the disclosed technology is limited in its scope to the details of construction and arrangement of components set forth in the following description or illustrated in the drawings. The disclosed technology is capable of other embodiments and of being practiced or carried out in various ways. As used in the specification and the appended claims, the singular forms "a," "an," and "the" include plural referents unless the context clearly dictates otherwise. It is intended that each term presented herein contemplates its broadest meaning as understood by those skilled in the art and can include all technical equivalents, which operate in a similar manner to accomplish a similar purpose. Ranges can be expressed herein as from "about" or "approximately" one particular value and/or to "about" or "approximately" another particular value. When such a range is expressed, another embodiment can include from the one particular value and/or to the other particular value. Similarly, values can be expressed herein as "about" or "approximately." By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

Referring now to the drawings, in which like numerals represent like elements, exemplary embodiments of the disclosed technology are herein described. It is to be understood that the figures and descriptions of the disclosed technology have been simplified to illustrate elements that are relevant for a clear understanding, while eliminating, for purposes of clarity, other elements found in typical test assemblies. Those of ordinary skill in the art will recognize that other elements can be desirable and/or can be required in order to implement the disclosed technology. However, because such elements are well known in the art, and because they can not facilitate a better understanding, a discussion of such elements is not provided herein.

Piezoelectric Gyroscopes

High-frequency capacitive gyroscopes can use the elliptical bulk resonance modes of a disk microstructure to enable Coriolis energy transfer between the two degenerate modes. For a perfectly square resonator, identical Lamb modes can exist at the same frequency propagating in X and Y directions, which can likewise enable Coriolis energy transfer between the two Lamb modes. In some cases, distortional stress-field patterns of such mode shapes can prevent efficient transduction by surface piezoelectric thin films. Identifying distinct resonance modes that can allow for piezoelectric transduction and demonstrate gyroscopic coupling can contribute to successful implementation of high-frequency piezoelectric gyroscopes.

FIG. 1 depicts a side view of a resonant gyroscope assembly 100, in accordance with some embodiments. In this example implementation, the assembly 100 can include a resonator body 102 suspended above (or adjacent to) a bulk substrate 104. In some embodiments, the resonator body 120 can be from 1 micron to 800 microns thick, as measured in a direction normal to the substrate's 104 upper surface. In some embodiments, the resonator body can be 100 microns wide to 1 cm wide, as measured in a direction parallel to the substrate's 104 upper surface. In some embodiments, the resonator body 102 can be suspended by suspension supports 112. The suspension supports 112, for example, can connect a portion of signal pad drive/sense regions 110 with a portion of the resonator body 102 to provide mechanical suspension for the resonator body 102 while still allowing free vibration in other portions of the resonator body 102. In some embodiments, the suspension supports 112 can also provide one or more electrical paths, for example, between the signal pad drive/sense regions 110 and the corresponding resonator drive/sense regions 106 on the resonator body 102.

In accordance with some embodiments, and with continued reference to FIG. 1, the signal pad drive/sense regions 110 can be disposed on an insulator layer 118, which can be disposed on a signal pad substrate 116. Thus, in some embodiments, the resonator body 102 can be suspended or supported by a combination of the bulk substrate 104, the insulator layer 118, the signal pad substrate 116, the signal pad drive/sense regions 110, and the suspension supports 112.

According to some embodiments, the active layer of the resonator drive/sense regions 106 and the signal pad drive/sense regions 110 can include materials such as aluminum nitride (AlN), zinc oxide (ZnO), lithium niobate (LiNbO$_3$), and/or other piezoelectric material. In accordance with some embodiments, the bulk substrate 104 and/or the signal pad substrate 116 can include silicon (Si). In another example implementation, the bulk substrate 104 and/or the signal pad substrate 116 can include gallium arsenide (GaAs). In accordance with some embodiments, the electrodes 120, 121 can include materials such as molybdenum (Mo) or other compatible materials as known in the art of microelectronics manufacturing. In some embodiments, the electrodes 120, 121 can comprise doped regions of the substrate. In some embodiments, electrode 120 can be used for actuation or sensing, and electrode 121 can constitute a ground base plane.

In some embodiments, a resonator gyroscope assembly 100 can comprise a resonator body 102 suspended adjacent to a substrate, a ground electrode 121 attached to a side of the resonator body, a piezoelectric layer 106 attached to a side of the ground electrode 121, a drive electrode 204 in electrical communication with the piezoelectric layer 106, and configured to stimulate a first vibration mode of the resonator body 102, 202, and a sense electrode 205 in electrical communication with the piezoelectric layer 106, and configured to receive an output from the resonator body 202 responsive to stimulation a second vibration mode.

In some embodiments, the first vibration mode and second vibration mode are mutually orthogonal. In some embodiments, the first vibration mode and second vibration mode are degenerate vibration modes. In some embodiments, the first vibration mode and second vibration mode are flexural vibration modes. In some embodiments, the square resonator body is suspended adjacent to the substrate by a suspension support in communication with the substrate. In some embodiments, a portion of the drive electrode and the sense electrode is supported by the suspension supports.

Disk Resonator Gyroscopes

In accordance with some embodiments, disk shapes can be used for resonator bodies. The degenerate in-plane flexural modes can show 10× larger electromechanical coupling coefficient as compared to conventional elliptical modes of the disk. This improvement can cause significant improvement in motional resistance, rate sensitivity, and thermomechanical noise performance.

Figure 3A:
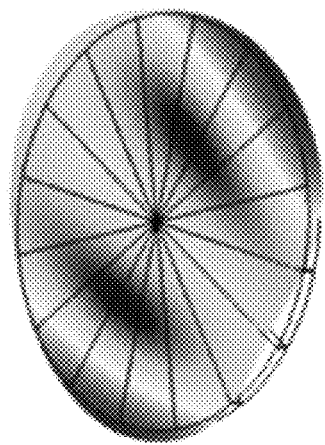
FIG. 3A depicts a round resonator vibrating in the drive mode.
Figure 3B:
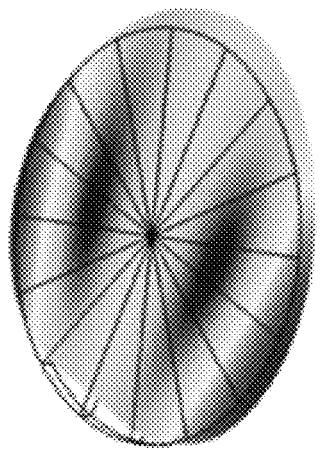
FIG. 3B depicts a round resonator vibrating in the sense mode.
Figure 2:
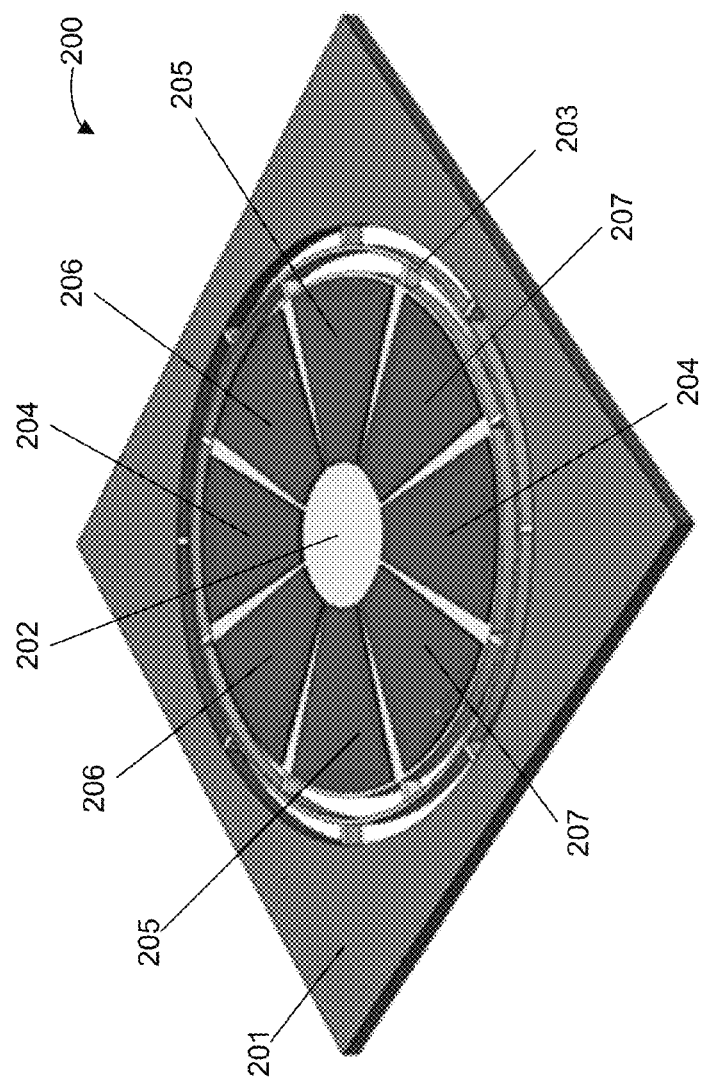
FIG. 2 depicts an AlN-on-Si disk gyroscope in accordance with some embodiments.

FIG. 2 depicts a schematic view of a resonator gyroscope assembly 200 in accordance with some embodiments having a disk resonator. In some embodiments, a gyroscope can comprise a resonator body 202, connected to a substrate 201 by a plurality of suspension supports 203. In some embodiments, a gyroscope can further comprise, a first and second drive-sense electrode 204, a first and second sense electrode 205, a first and second drive-tuning electrode 206, and a first and second drive-excitation electrode 207. FIG. 3A depicts a resonator body in a degenerate drive flexural mode shape, and FIG. 3B depicts a resonator body 202 in a degenerate sense flexural mode shape, both of the gyroscope depicted in FIG. 2. In some embodiments, the resonator body can be anchored to the substrate by a network of circularly symmetric peripheral T-supports 203. As will be appreciated by persons having skill in the art, where T-supports are used, structural mode split between the drive and sense modes can be minimized. This configuration can also facilitate integration of multiple isolated transduction ports used for device operation.

In some embodiments, a resonator gyroscope assembly 200 can further comprise a drive-tuning electrode 206 in electrical communication with the piezoelectric layer, and configured to mode-match the first and second vibration modes of the resonator body 202. In some embodiments, a resonator gyroscope assembly 100 can further comprise a plurality of drive-tuning electrodes 206. In some embodiments, a resonator gyroscope assembly can further comprise a drive-stimulation electrode 207 in electrical communication with the piezoelectric layer 106, and configured to drive the piezoelectric layer 106 at a resonant frequency of the resonator body 202. In some embodiments, a resonator gyroscope assembly 100 can further comprise a plurality of drive-stimulation electrodes 207.

Square Resonator Gyroscopes

In accordance with some embodiments, rectangular shapes can be used for resonator bodies. Rectangular bar silicon resonators can be considered as acoustic waveguides with finite dimensions. According some embodiments, several resonance modes of these structures can be approximately attributed to Lamb modes of an infinitely long waveguide. Certain operational characteristics of the microstructure devices disclosed herein can be illustrated by resonance modes and dispersion characteristics of Lamb modes in acoustic waveguides.

As will be understood by one of skill in the art, Lamb waves can propagate in solid plates. Lamb waves can be considered elastic waves whose particle motion lies in the plane that contains the direction of wave propagation and the plate normal. An infinite medium, for example, can typically support just two wave modes traveling at unique velocities. Rectangular bar resonators can support additional Lamb wave modes, whose velocities depend on the relationship between wavelength and dimensions of the resonator.

Figure 4:
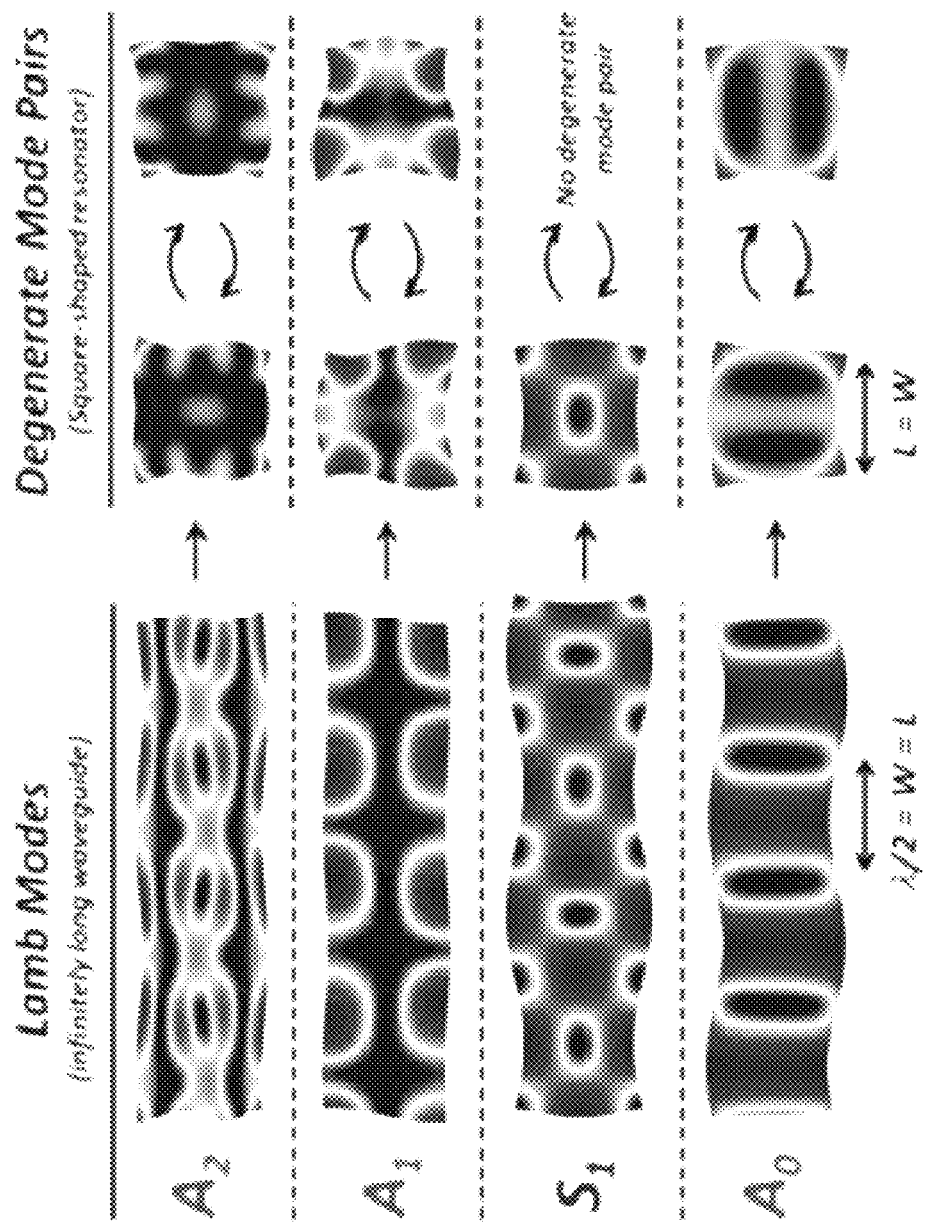
FIG. 4 (left column) depicts Lamb mode shapes for an extended silicon acoustic waveguide with characteristic width of 300 μm and thickness of 20 μm, and (right column) the corresponding resonance mode shapes for a square resonator.

FIG. 4 depicts simulated Lamb mode shapes (left column) for an extended silicon acoustic waveguide with characteristic width of 300 μm and thickness of 20 μm. FIG. 4 depicts the corresponding resonance mode shapes (right column) for a square resonator. In-plane-polarized Lamb modes in a silicon waveguide can be categorized into extensional (S) and flexural (A) modes, depending on symmetry or antisymmetry of the particle polarization with respect to the X-axis. For rectangular resonators with finite length (L) and terminated by stress-free boundary condition, the resonance modes with Y-axis symmetry can be attributed to the Lamb modes propagating in X direction with a wave-length of $\lambda_X = 2L/(2n-1)$, while those with X-axis symmetry and finite width (W) can be attributed to the Lamb modes propagating in Y direction with a wave-length of $\lambda_Y = 2W/(2n-1)$, where n is an integer.

For a perfectly square resonator, identical Lamb modes can exist at the same frequency propagating in X and Y directions. While symmetric (Si) modes can couple together acoustically to form one single extensional resonance mode (such as Lamé or square-extensional modes), such a coupling does not typically happen for anti-symmetric Lamb modes (Ai), thus resulting in degenerate flexural mode pairs. In accordance with some embodiments, such orthogonal mode pairs can be used for Coriolis-based resonant rotation rate sensing. Some embodiments of the disclosed technology can rely on the coupling of gyroscopic energy between orthogonal mode pairs as the device rotates to sense the rotation.

In some embodiments, the square resonator can deviate from a perfect square. For example and not limitation, fabrication non-idealities or material impurities can cause the orthogonal vibration modes to have a frequency mismatch. In some embodiments, such a frequency mismatches between modes can be compensated by using piezoelectric stiffening tuning. For example, in some embodiments, piezoelectric stiffening tuning can be accomplished by biasing the drive/sense electrodes with a DC signal to slightly tune the resonant frequency of the resonator. In some embodiments, the frequency split between modes can be at least partially compensated or eliminated using post-fabrication trimming of the resonator body. In some embodiments, the frequency split can be corrected using the dynamic mode-matching technique described herein.

Figure 5:
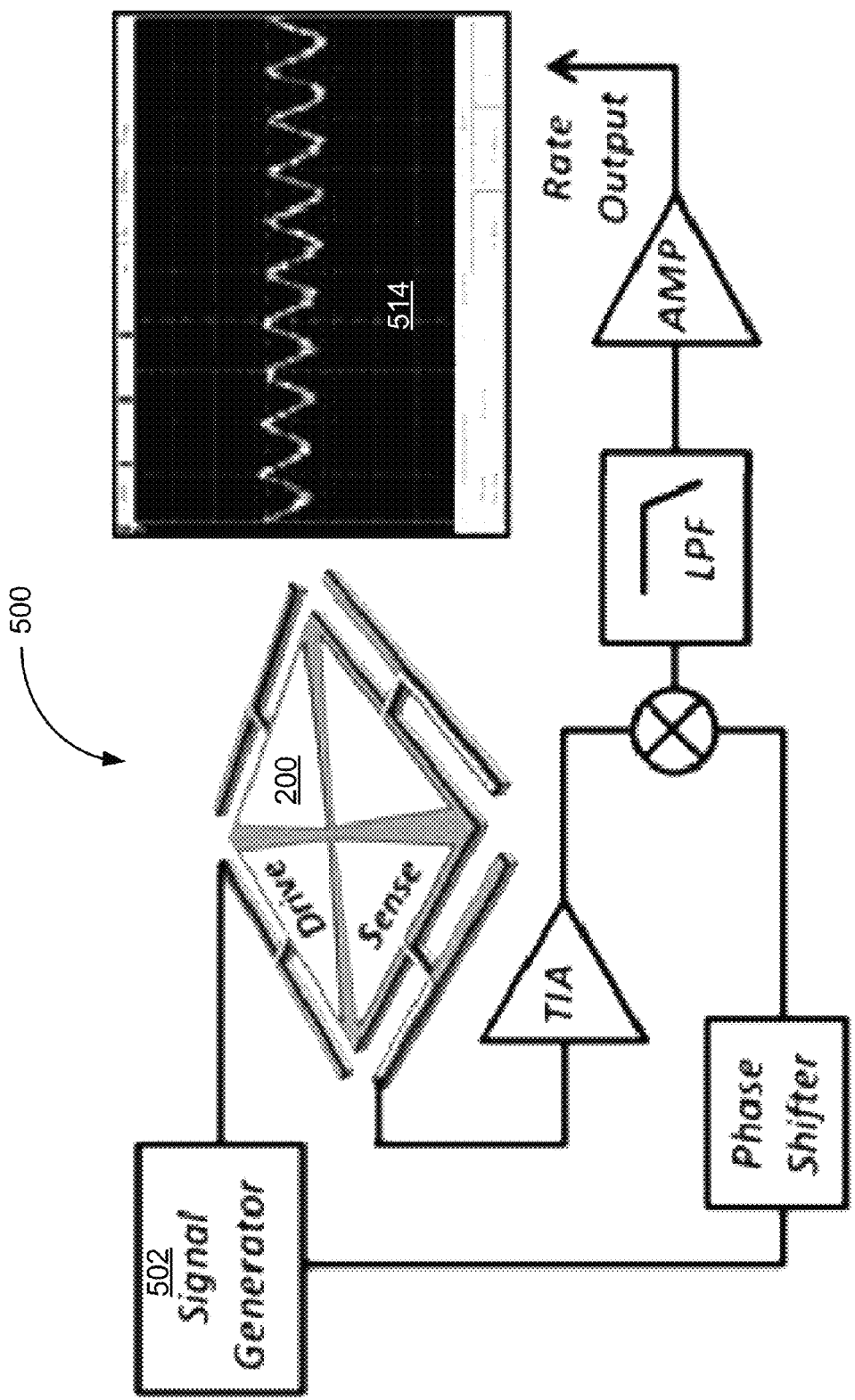
FIG. 5 is a diagram of an example interface circuit 500 that can be utilized to detect angular rate information of a gyroscope device, according to some embodiments.

FIG. 5 is a diagram of an interface circuit 500 that can be utilized to detect angular rate information of a gyroscope device, according to some embodiments. In this example implementation, the gyroscope device can be operated in an open-loop configuration by applying an external sinusoidal voltage to the drive electrode of the device. According to some embodiments, the current generated at the sense electrode of the device can be processed in the sense channel of the interface circuit 500 to extract the Coriolis signal. In an example implementation, the sense channel can include a current-to-voltage converter and a synchronous demodulator to detect the applied rotation rate.

Figure 6B:
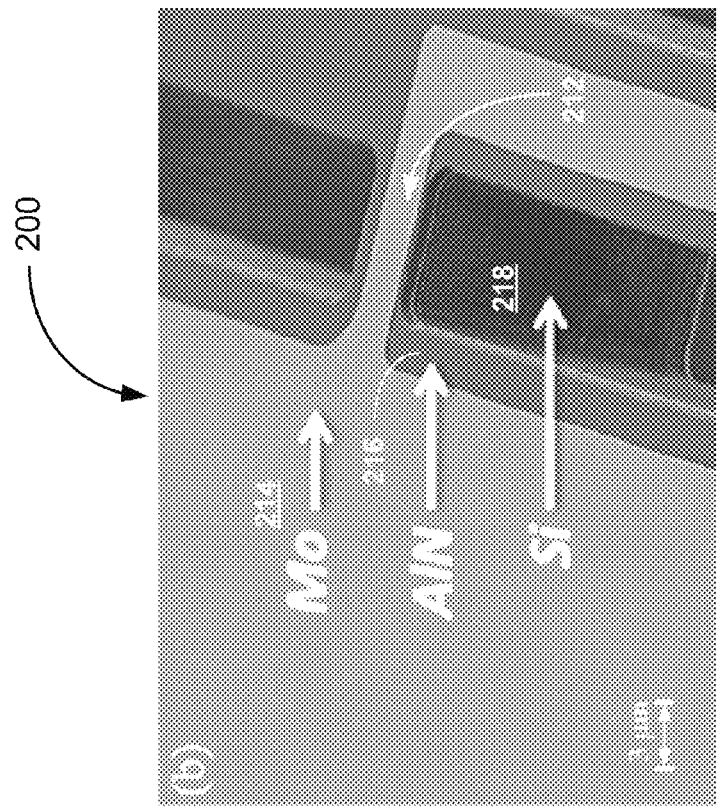
FIG. 6B is a close-up SEM view of the device 200 as shown in FIG. 6A.
Figure 6A:
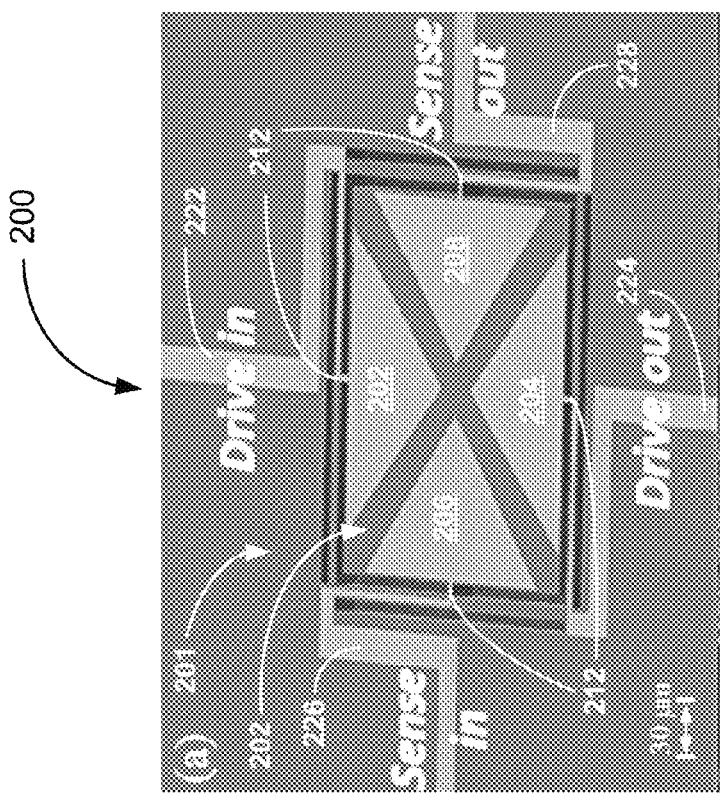
FIG. 6A is a scanning electron microscope (SEM) view of a fabricated example resonant square gyroscope device 200, according to some embodiments.

FIG. 6A shows a scanning electron microscope (SEM) view of a fabricated resonant square gyroscope device 200, according to an embodiment. The device 200 shown in FIGS. 6A-6B can have similar representative features/regions as the resonant gyroscope device 100 described above with reference to FIG. 1. In accordance with some embodiments, the fabricated example resonant square gyroscope device 200 can include a drive input electrode 222 in communication with a drive input region 202 on the resonator body 202. In some embodiments, the device 200 can include a drive output electrode 224 in communication with a drive output region 204 on the resonator body 202. In some embodiments, the device 200 can include a sense input electrode 226 in communication with a sense input region 206 on the resonator body 202. In some embodiments, the device 200 can include a sense output electrode 228 in communication with a sense output region 208 on the resonator body 202.

In accordance with some embodiments, as shown in FIG. 6A, the electrodes 222, 224, 226, 228 can be in communication with the respective regions 202, 204, 206, 208 on the resonator body 202 via continuous electrodes that can traverse and can be supported by the suspension supports 212 that join the resonator body 202 to the device 200 and provide suspension support for the resonator body 202.

FIG. 6B is a close-up SEM view of the fabricated example resonant square gyroscope device 200 as shown in FIG. 6A. This view shows a suspension support 212 area of the device 200. This particular example device 200 includes a 20 µm thick silicon structural body 218 and a 700 nm thick AlN piezoelectric transducer 216 sandwiched between 50 nm thick molybdenum (Mo) electrodes 214.

The fabricated example embodiment of a resonant square gyroscope device 200 as shown in FIG. 6A and FIG. 6B is approximately 300 µm in width, 300 µm in length, and 20 µm in height. The resonator body 202 of the example gyroscope is supported using the narrow suspension supports 212 beams to facilitate axial displacement of resonance modes antinodes. The device can be fabricated using a process as will be described below. According to some embodiments, certain electrode geometry has been used to minimize quadrature cross-talk between drive and sense resonance modes.

In accordance with some embodiments of the disclosed technology, the resonator body 202 can have a thickness ranging from about one micron to hundreds of microns. In accordance with some embodiments, the resonator body 202 can have a width, length, and/or diameter ranging from about 100 microns to about one centimeter. In some embodiments, the resonator body 202 dimensions can be selected to provide stiffness. In some embodiments, the resonator body 202 can be designed with a certain mass to mask Brownian noise. In some embodiments, the thickness, size, mass, etc. of resonator can be chosen to minimize noise for a particular application.

Dynamic Mode Matching

In some embodiments, a resonant gyroscope assembly can have a resonator body that is mode-matched. A mode-matched device is one having a first and second vibration modes that are mutually orthogonal, and are tuned to have approximately the same resonant frequency. While an ideal device with symmetric dimensions can be inherently mode-matched, process non-idealities and other problems can cause a mis-match between the first and second vibration modes. In some embodiments, a dynamic mode-matching technique can be used to provide a bidirectional linear tuning capability to minimize this frequency mis-match. Considering an equivalent spring-mass-dashpot model for the resonator body 200, the effect of the electromechanical active tuning can be explained by inclusion of the feedback force in the equation of motion, $$M\frac{d^2x}{dt^2} + D\frac{dx}{dt} + Kx = F_{drive} + F_{tune}$$

where M, D, and K are the equivalent mass, damping and stiffness parameters of the drive mode, x is the drive mode displacement, $F_{drive}$ is the actuation force, and $F_{tune}$ is the tuning force fed back to the drive mode. Since $F_{tune}$ can be generated by integration and scaling of the output current of the drive mode, which is proportional to the drive-mode velocity, this force is proportional to the drive-mode displacement, i.e., $$F_{tune} = V_T R_F \eta^2 x$$

where $V_T$, $R_F$, and $\eta$ are the DC scaling voltage, transimpedance gain, and transduction coefficient, respectively. Therefore, the equation of motion can be rewritten to show the dynamic softening or stiffening of the equivalent spring constant, or in other words, bidirectional tuning of the drive mode, based on the polarity of the scaling parameter.

$$M\frac{d^2x}{dt^2} + D\frac{dx}{dt} + (K - V_T R_F \eta^2)x = F_{drive}$$

Figure 7:
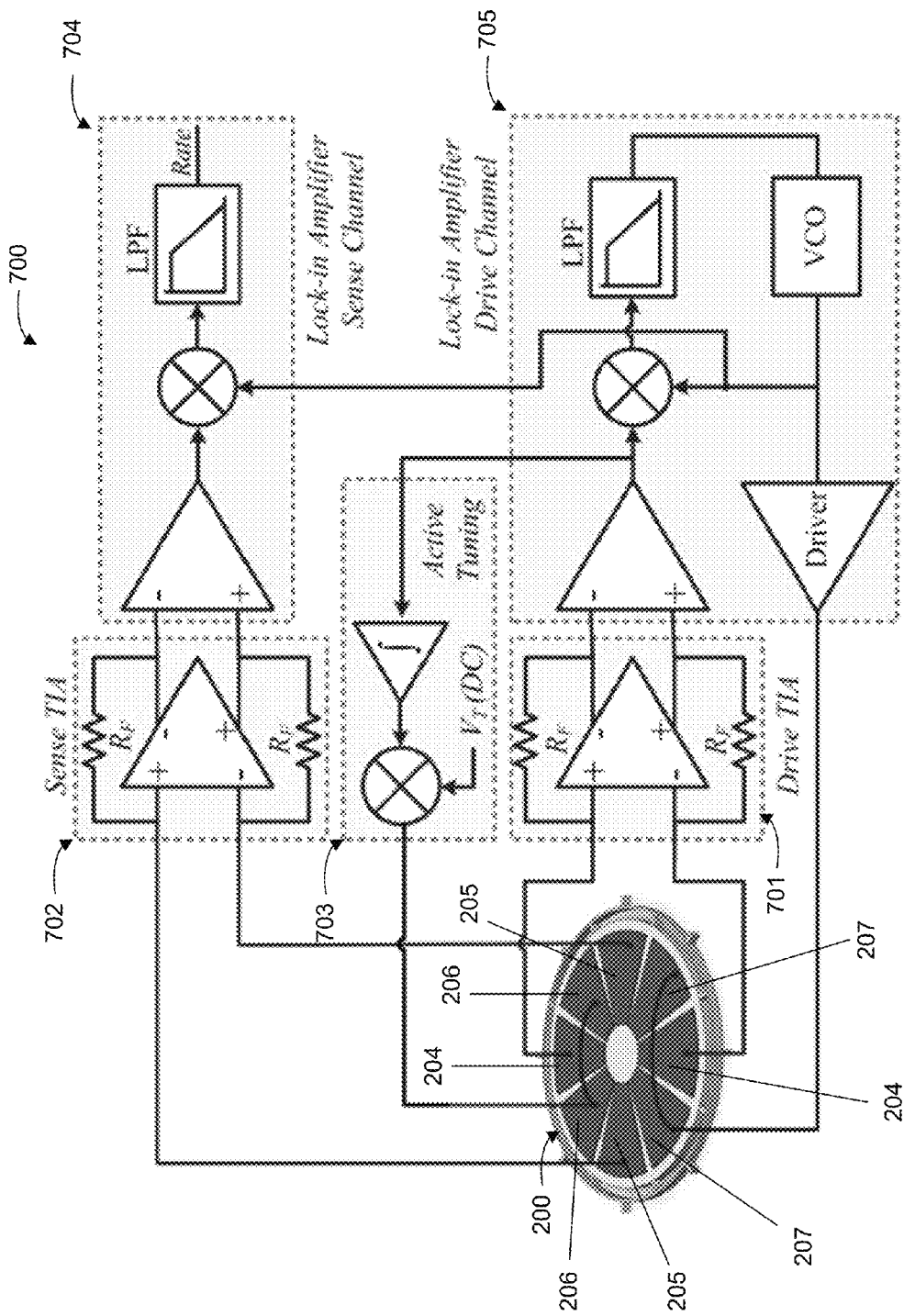
FIG. 7 depicts interface circuitry with a gyroscope in accordance with some embodiments.

FIG. 7 depicts interface architecture 700 for dynamic mode-matching a gyroscope in accordance with some embodiments. In some embodiments, the dynamic mode-matching can be accomplished via electromechanical feedback of the drive-mode displacement signal to the drive-tuning electrodes 206. In some embodiments, discrete differential transimpedance amplifiers (TIAs) can be used for current pick-off from both the drive 701 and sense modes 702. In an experiment, the sense channel of a Lock-in Amplifier 704 was used to process the output of the sense TIAs 702 for detection of the angular rotation rate. The drive channel of a Lock-in Amplifier 705 was used to process the output of the drive TIAs 701 to implement an oscillator loop to actuate the drive mode at its resonance frequency. Common-mode application of the drive signal and differential readout of the drive- and sense-mode output currents can enable independent actuation of the drive mode, without the excitation of the sense mode, as well as suppression of symmetric spurious modes. In some embodiments, a coherent AM demodulation architecture can extract rotation rate information from the Coriolis component of the sense-mode output.

In some embodiments, the drive-mode displacement signal can be generated by an Active Tuning circuit 703. In some embodiments, the Active Tuning circuit 703 integrates the velocity-proportional output current of the drive mode 701. In some embodiments, the Active Tuning circuit 703 multiplies the displacement signal based on a tuning voltage, such as by analog amplifier. This scaled displacement signal can then be fed back to the common-mode drive-tuning electrodes 206 to dynamically modify the drive-mode effective stiffness, thereby provide linear, bidirectional tuning to the drive-mode resonance frequency, without affecting the sense-mode dynamics.

Fabrication

Some embodiments can be fabricated using, in part, fabrication processes and materials known to persons of ordinary skill in the art. For example, suspended, piezoelectric resonators can generally be manufactured in a process as described in, for example, "Thin-film piezoelectric-on-substrate resonators with Q enhancement and TCF reduction," W. Pan and F. Ayazi, PROC. IEEE INT. CONF. MEMS, January 2010, pp. 104-107, which is incorporated herein by reference in its entirety, as if fully set forth herein. Some embodiments of the present technology can be fabricated using the specific methods disclosed in detail below.

Figure 8:
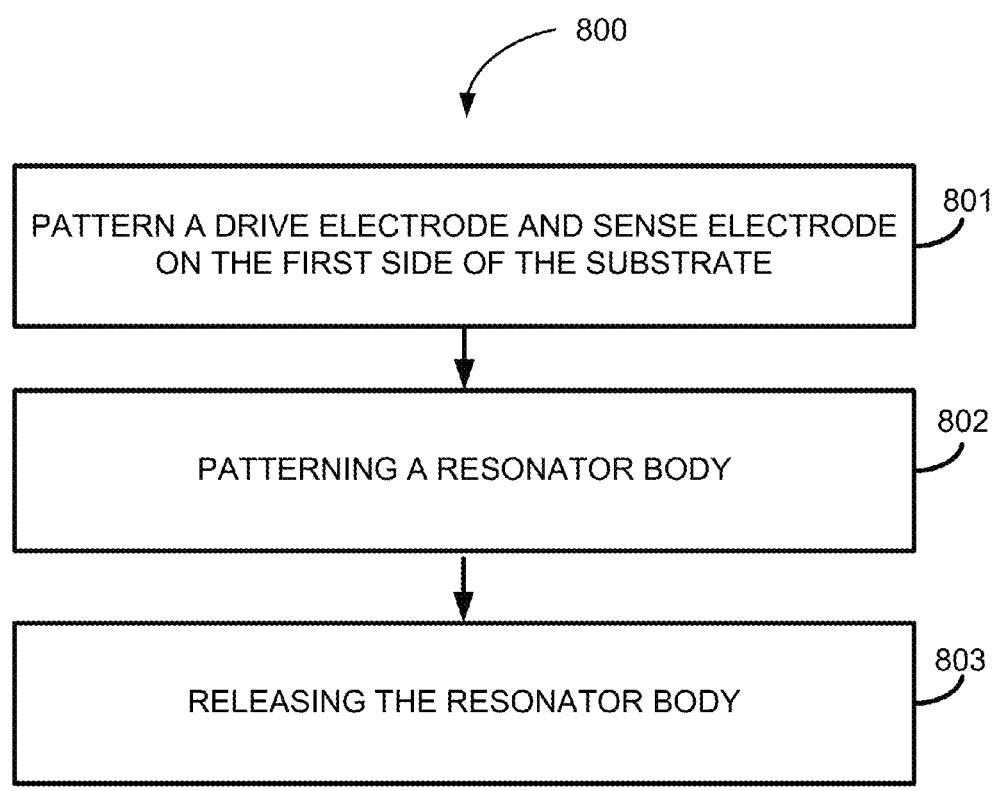
FIG. 8 is a flow diagram of a method for fabricating gyroscopes, according to some embodiments.

FIG. 8 is a flow diagram of a method 800 for making a gyroscope resonator, according to some embodiments. In block 801, the method 800 includes patterning a drive electrode and a sense electrode on the first side of the substrate. In accordance with some embodiments, the substrate comprises a first conductive layer and second conductive layer separated by piezoelectric layer attached to a first semiconductor layer and a second semiconductor layer separated by an insulator layer, and wherein the patterning removes a portion of the first conductive layer. In block 802, the method 800 includes patterning a resonator body by removing a portion of the first conductive layer, piezoelectric layer, second conductive layer, and substrate defining a shape of a resonator. In block 803, the method 800 includes releasing the resonator body by removing a portion of the second semiconductor layer and insulator layer of the substrate approximately disposed adjacent to the resonator body.

In accordance with some embodiments, the piezoelectric material can include, but is not limited to materials such as AlN, ZnO, PZT, LiNbO3, GaN, and mixtures thereof. In some embodiments, the piezoelectric material can be any piezoelectric material as known in the art.

In some embodiments, the resonator body can be made from a material such as one or more of fused quartz, polysilicon, silicon oxide, monocrystalline silicon, silicon carbide, metallic materials, GaAs, diamond and mixtures thereof.

In accordance with some embodiments, the first and second semiconductor layers can include material such as fused quartz, polysilicon, silicon oxide, monocrystalline silicon, silicon carbide, metallic materials, GaAs, AlN, ZnO, and LiNbO3, GaN, diamond and mixtures thereof.

In some embodiments, the resonator body can be patterned, for example, by removing a portion of the first conductive layer substrate defining a shape of a suspension support in communication with the substrate and the square resonator body.

In some embodiments, the drive electrode and the sense electrode can be at least partially supported by the suspension supports.

According to some embodiments, one or more of the electrodes can include a compatible conductive material as known in the art. For example, in one implementation, the electrodes can include doped silicon. In other words, all or a portion of an electrode can be fabricated by selectively doping certain regions to make them conductive, rather than fabricating electrodes by depositing electrode material on the silicon. In other example implementations, the electrodes can be fabricated by depositing electrode material on a substrate, or other layer associated with the device.

In accordance with some embodiments, electrodes can be disposed immediately above the piezoelectric material. In some embodiments, the electrodes can be disposed immediately below the piezoelectric material. In yet other example implementations, the electrodes can be disposed on a top and/or bottom surface of the resonator.

In accordance with some embodiments, the general layer structure of certain portions of the gyroscope resonator device 100 can be Si/Mo/AlN/Mo, where the piezoelectric (AlN piezoelectric material in this example) can be sandwiched between electrodes (Mo electrodes in this example). Similarly, other example layer structures can include Si/AlN/Mo (i.e., a top electrode) and/or Si/Mo/AlN (i.e., a buried electrode).

EXAMPLE 1

FIG. 9A-C shows the SEM images of a fabricated disk resonator gyroscope in accordance with some embodiments. In this embodiment, a 1-mm-diameter piezoelectrically transduced disk gyroscope comprised of a 1.3-µm thin film of AlN sandwiched between Molybdenum (Mo) electrode layers and stacked upon a 35-µm-thick (100) plate of single-crystal silicon. The bottom Mo electrode is used as the common terminal and the electrically-isolated top Mo electrodes are used for actuation, sensing and tuning of the gyroscope. The device was fabricated using a 4-mask AlN-on-Si process similar to the one described in W. Pan et al., "Thin-film piezoelectric-on-substrate resonators with Q enhancement and TCF reduction," PROC. MICRO ELECTRO MECHANICAL SYSTEMS (MEMS), 727, 730 (2010).

In the embodiment depicted in FIGS. 9A-C, the gyroscopic coupling between the two degenerate in-plane flexural modes of a 1-mm-diameter disk structure having a resonance frequency of 4.34 MHz was verified by finite element analysis using COMSOL Multiphysics. A quality factor (Q) of 4000, obtained from experimental results of the fabricated gyroscope, operating in air, was assumed in the simulations. Drive and sense electrode configuration and placement have been used to guarantee orthogonal transduction of the drive and sense modes. As a result, application of the drive excitation to the drive electrode pair does not cause any undesired electromechanical coupling to the sense mode, because of incompatibility with piezoelectric stress-field pattern. The simulated sense-mode zero-rate output current level is more than 60 dB lower than the drive mode current.

Figure 10:
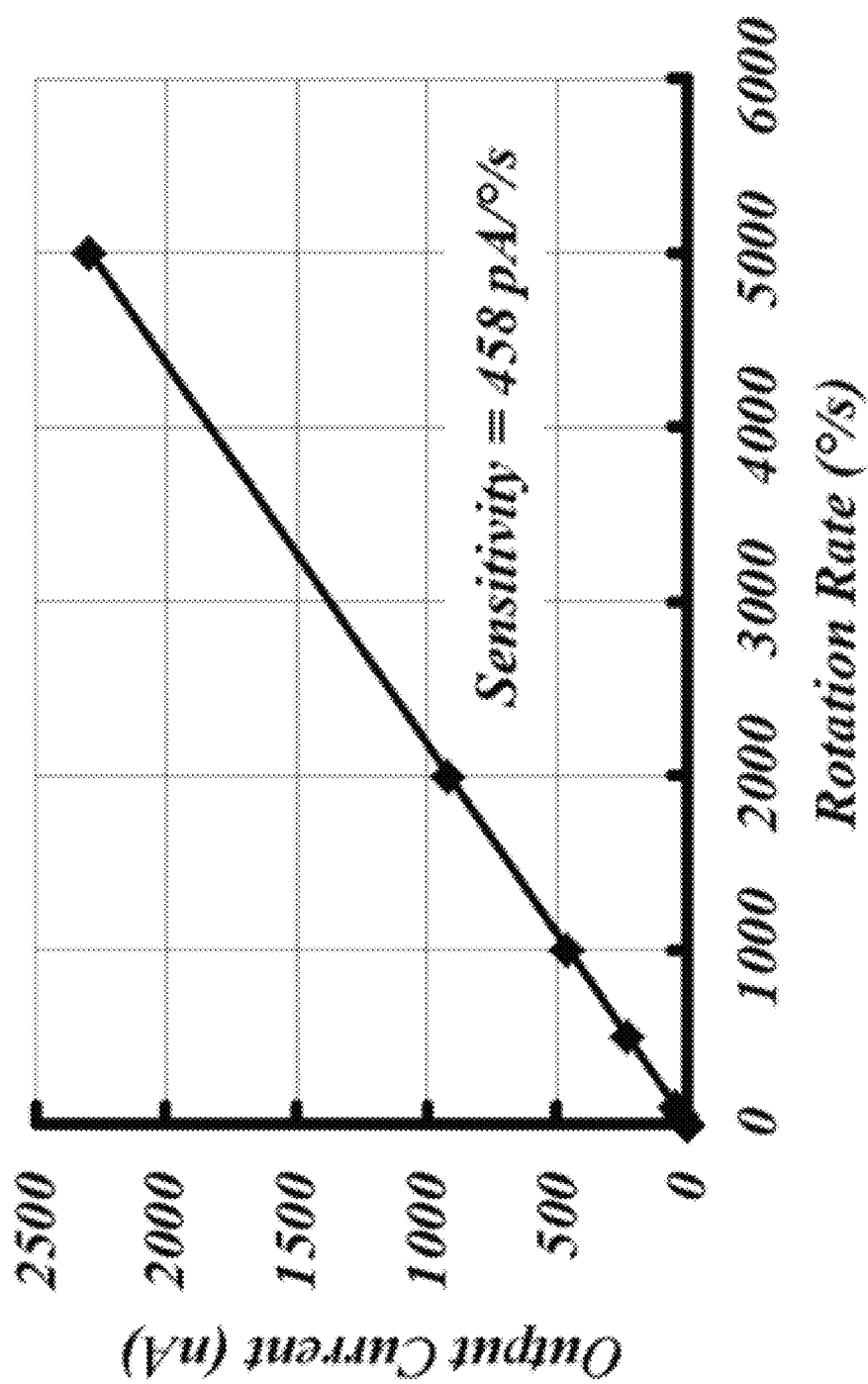
FIG. 10 depicts simulated output current amplitude of a gyroscope in accordance with some embodiments due to applied z-axis rotation.

The device of FIGS. 9A-C was actuated by applying a 1-Vp signal to induce a maximum drive-mode kinetic energy of 5.5 nJ. The Coriolis-induced output current is sensed differentially at the location of zero-stress drive signal to further improve modal decoupling. The simulated rotation rate sensitivity of the piezoelectric gyroscope was extracted to be 458 pA/°/s, as shown in FIG. 10, demonstrating a wide linear input range. The gyroscopic modal coupling factor was calculated to be 0.37 for the in-plane flexural modes of the disk structure. Although this is smaller than the gyroscopic coupling factor for the secondary elliptical mode pair (~0.6), the significant improvement in the electromechanical transduction of the flexural mode over the elliptical mode notably enhances the performance of the gyroscope.

Figure 12:
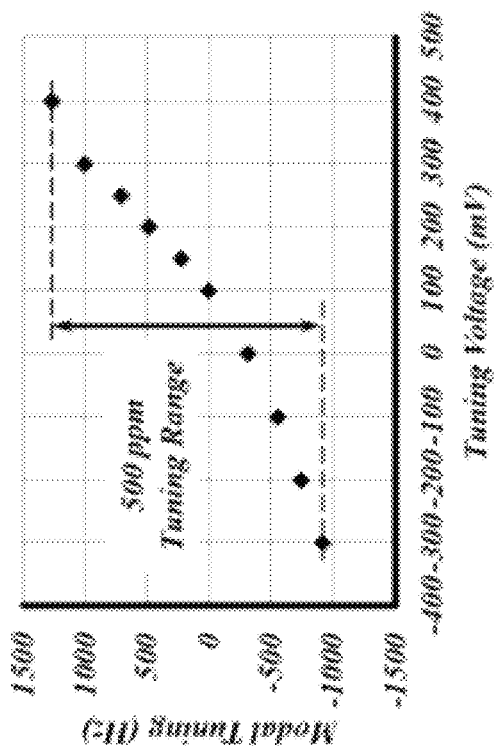
FIG. 12 depicts a tuning range of a gyroscope in accordance with some embodiments.
Figure 11:
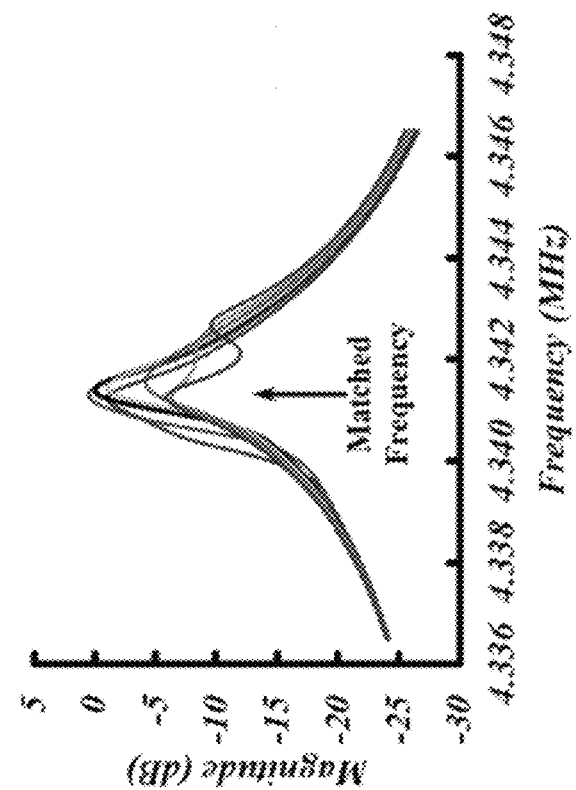
FIG. 11 depicts a bidirectional tuning response of a gyroscope in accordance with some embodiments.

The bidirectional tuning capability of the drive mode was implemented on a PCB prototype using discrete components. The drive-mode velocity signal taken from the lock-in amplifier is integrated and scaled on the board and fed back to the device to tune the drive mode resonance frequency by a small DC tuning voltage. FIG. 11 shows the frequency response of the gyroscope from the drive input to the sense output for different applied tuning voltages, displaying a sweep of the drive peak across the sense-mode resonance frequency. The electromechanical feedback tuning technique demonstrates resonance frequency tuning range of 2200 Hz (~500 ppm), to compensate for the modal frequency split caused by process non-idealities and crystallographic misalignments. As can be seen in the frequency response in FIG. 11, the effective quality factor of the device increases as the drive peak approaches the sense resonance frequency, improving the sensitivity of the gyroscope. FIG. 12 shows the dynamic tuning curve of the drive mode resonance frequency for tuning voltages of −300 mV to +400 mV.

Figure 13:
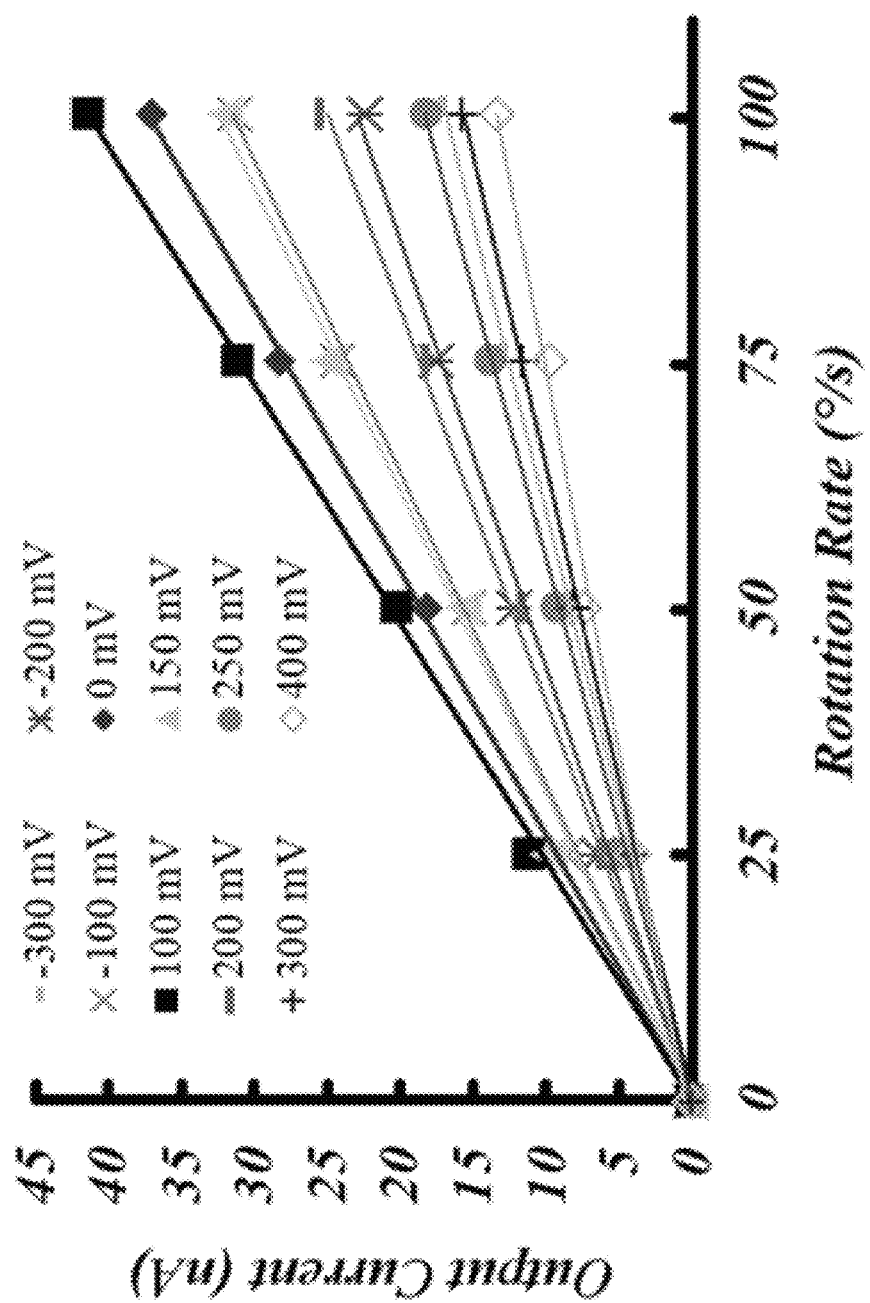
FIG. 13 depicts a measured rotation rate response of a gyroscope in accordance with some embodiments at different tuning voltages.

FIG. 13 shows the rotation rate response of the gyroscope for different applied tuning voltages demonstrating a maximum measured sensitivity of 410 pA/°/s under mode-matched conditions, for an applied drive signal of 1 Vp, which shows very close agreement with simulation results shown in FIG. 10.

Figure 14:
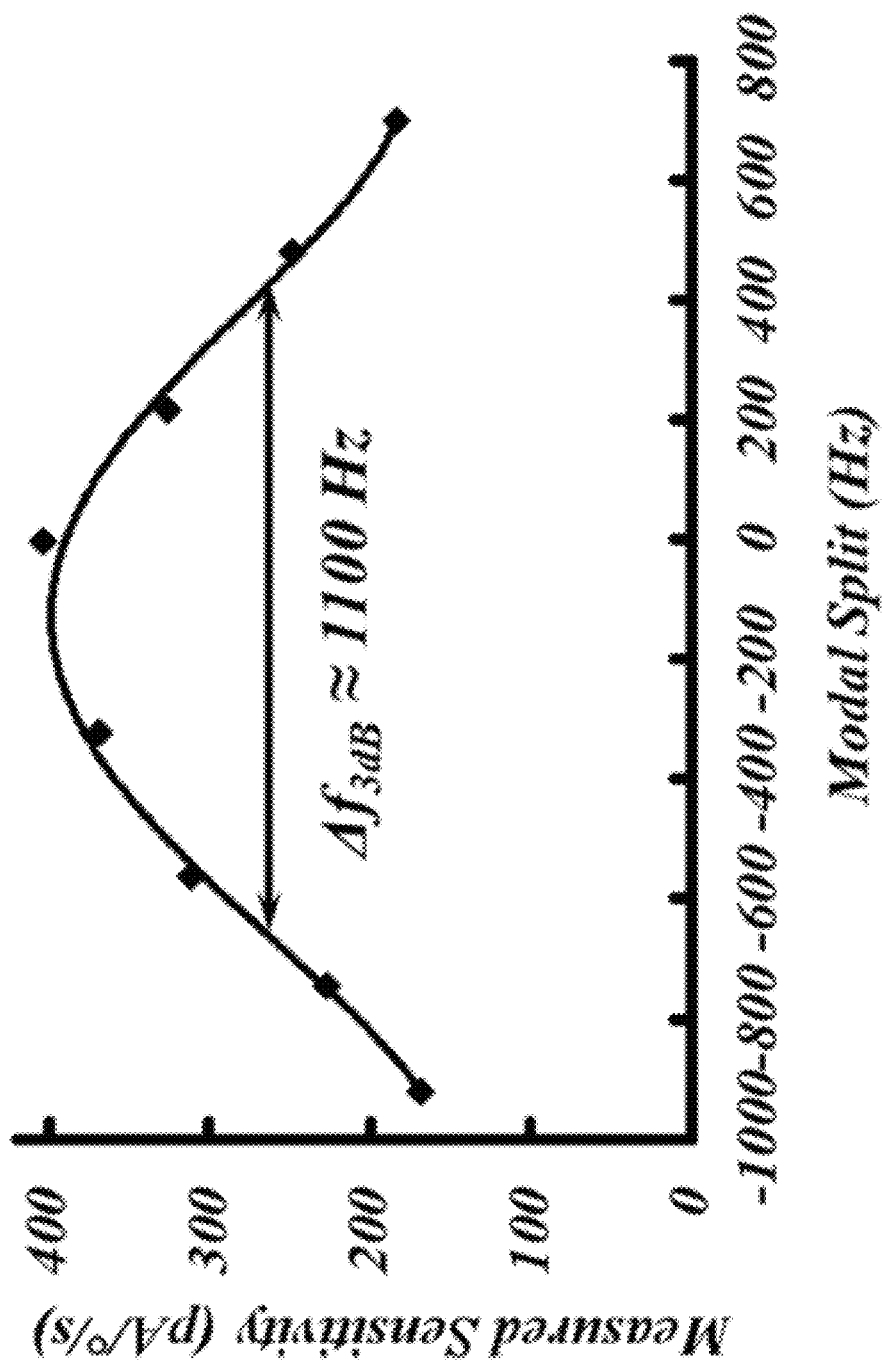
FIG. 14 depicts a measured sensitivity of a gyroscope in accordance with some embodiments as a function of modal split.

The rotation rate sensitivity of the gyroscope is plotted in FIG. 14, against the frequency split controlled by the applied tuning voltage, signifying a 3-dB bandwidth of ~1100 Hz which corresponds to the sense-mode quality factor, confirming that as the drive-mode frequency is tuned dynamically, the Coriolis-induced displacement and so the angular rate sensitivity, varies according to the frequency response of the sense mode.

EXAMPLE 2

The gyroscopic coupling between the two orthogonal flexural mode pairs of a square resonator ($A_0$) were modeled using a COMSOL Multiphysics simulation tool for a 300 μm×300×20 μm silicon square resonator having a thin (<1 μm) AlN electrode layer. The single-crystal silicon resonator was modeled aligned to the <110> direction of a (100) silicon plate. A quality factor (Q) of 3000, obtained from the measured results of a fabricated sample operating in air, was assumed for the resonance modes. The modeled resonator device was actuated by applying a 1.6 V (peak) harmonic signal to the drive electrode, resulting in the antinode displacement of ~32 nm at the resonance frequency, which in turn induces Coriolis-induced current at the sense electrode when a finite rotation rate is applied.

Figure 15:
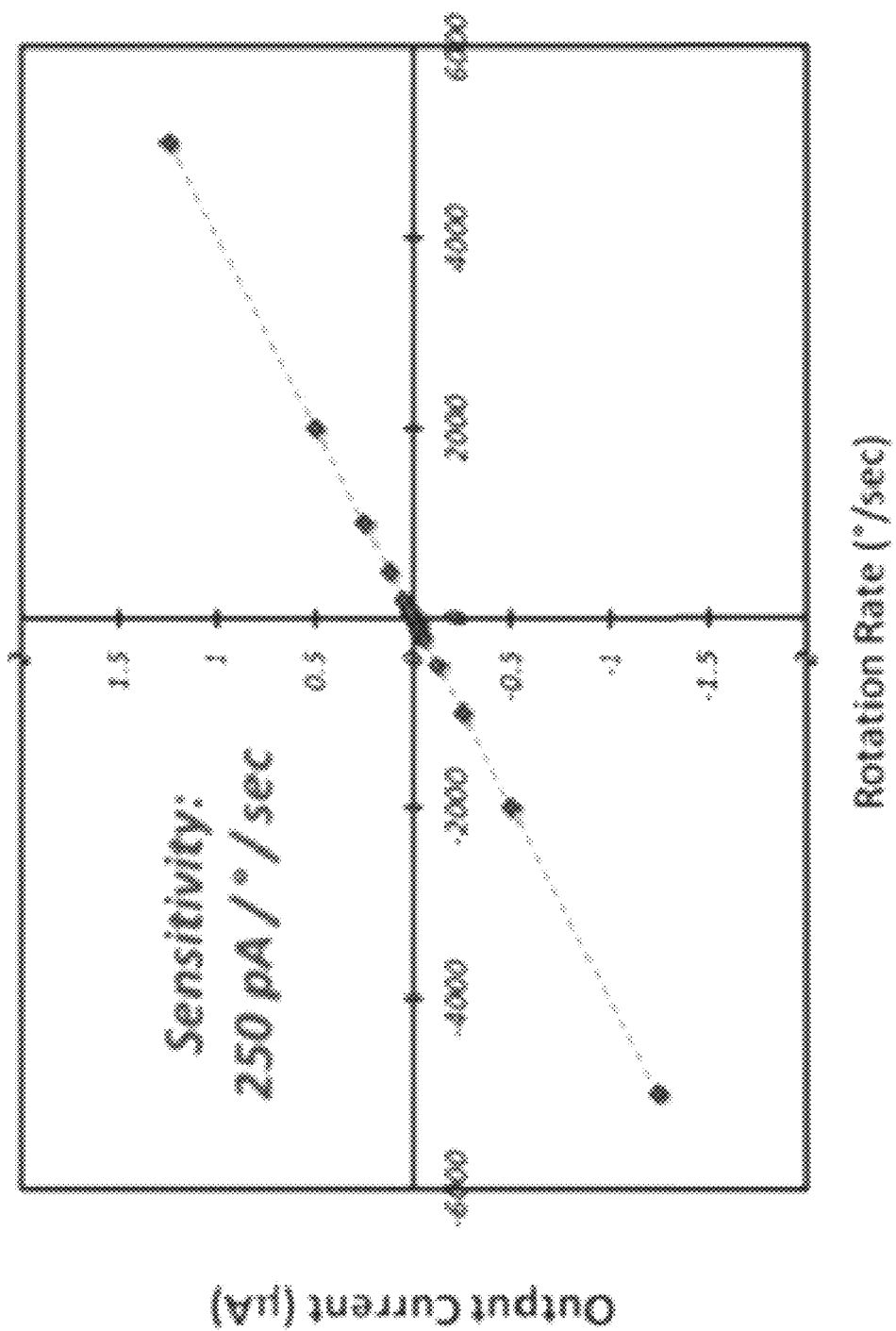
FIG. 15 depicts a simulated Z-axis rate response of a square gyroscope.

FIG. 15 shows the simulated Z-axis rate response of the square gyroscope, resulting in a sensitivity of about 250 pA/°/s per electrode. A mechanical noise equivalent rotation rate of 0.01/Vs/A/Hz has been extracted for the square gyroscope operating in linear regime with a drive voltage of 1.6 Vpeak, and an improved Q of 5000.

EXAMPLE 3

Figure 16:
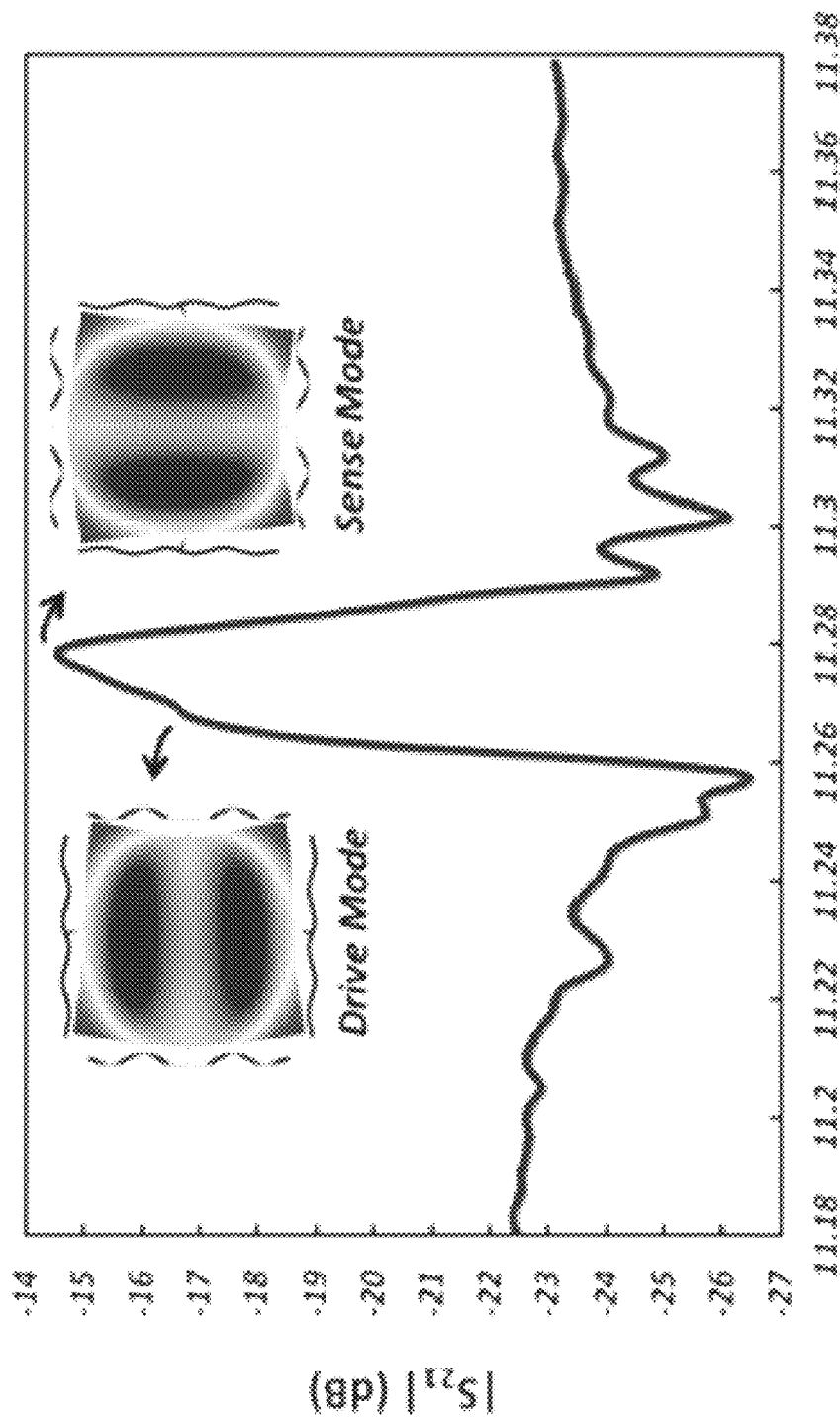
FIG. 16 depicts a measured frequency response of an example gyroscope device, according to some embodiments.

FIG. 16 shows the measured frequency response of an example gyroscope device operating in A0 mode (i.e. first flexural mode), observed from the drive input to sense output electrode. The observed frequency split of approximately 10 kHz (<1000 ppm) between the two modes is attributed to process non-idealities.

Figure 17:
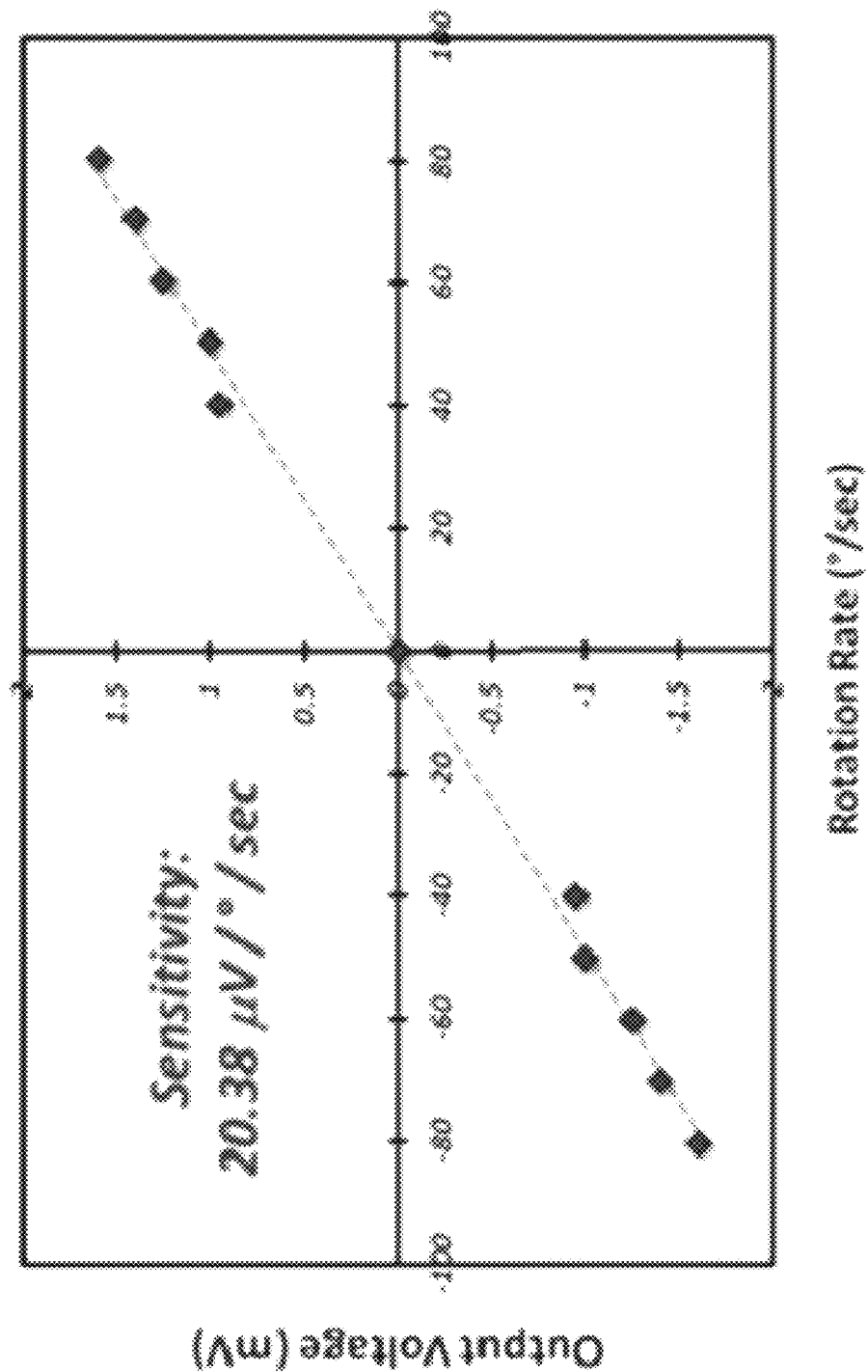
FIG. 17 depicts a measured response of an experimental piezoelectric gyroscope device to Z-axis rotation rates, according to some embodiments.

FIG. 17 depicts a measured response of an experimental piezoelectric gyroscope device to Z-axis rotation rates, as measured using a rate table and a read-out circuit (similar to the circuit 500 as shown in FIG. 5). In this example, the gyroscope device was excited in its first flexural mode (~11 MHz) and characterized for different input rotation rates resulting in a sensitivity of 20.38 pV/°/s for a sinusoidal drive voltage of 1.6 V (peak), which is comparable to capacitive BAW disk micro-gyroscopes with similar resonance frequency and drive/sense modes frequency.

The measured rate sensitivity is in close agreement with the value extracted from simulation (19.6 pV/°/s), considering the 680 k-ohm current-to-voltage gain of the transimpedance amplifier and taking into account the frequency split of 10 kHz at the resonance frequency of 11.279 MHz versus mode-matched simulated response shown in FIG. 15. The preliminary implementation and characterization result demonstrates the feasibility of rotation rate sensing using orthogonal degenerate flexural modes in silicon square resonant structures excited with thin piezoelectric films.

Numerous characteristics and advantages have been set forth in the foregoing description, together with details of structure and function. While the disclosed technology has been presented in several forms herein, it may be apparent to those skilled in the art that many modifications, additions, and deletions, especially in matters of shape, size, and arrangement of parts, can be made therein without departing from the spirit and scope of the disclosure and its equivalents as set forth in the following claims. Therefore, other modifications or embodiments as may be suggested by the teachings herein are particularly reserved as they fall within the breadth and scope of the claims.

The invention claimed is:
1. A resonator gyroscope assembly comprising:
    a square resonator body suspended adjacent to a substrate;
    a ground electrode attached to a side of the resonator body;
    a piezoelectric layer attached to a side of the ground electrode;
    a drive electrode in electrical communication with the piezoelectric layer, and configured to stimulate a first vibration mode of the square resonator body; and a sense electrode in electrical communication with the piezoelectric layer, and configured to receive an output from the square resonator body responsive to stimulation of a second vibration mode of the square resonator body.

2. The resonator gyroscope assembly of claim 1, wherein the piezoelectric layer is composed of a material selected from the group consisting of: AlN, ZnO, PZT, GaN, LiNb03, and mixtures thereof.

3. The resonator gyroscope assembly of claim 1, further comprising a tuning electrode in electrical communication with the piezoelectric layer, and configured to match a resonant frequency of the first vibration mode of the resonator body and a resonant frequency of the second vibration mode of the resonator body.

4. The resonator gyroscope assembly of claim 1, further comprising a tuning electrode in electrical communication with the piezoelectric layer, and configured minimize a zerorotation rate output voltage.

5. The resonator gyroscope assembly of claim 1, wherein the first vibration mode and second vibration mode are mutually orthogonal.

6. The resonator gyroscope assembly of claim 1, wherein the first vibration mode and second vibration mode are degenerate vibration modes.

7. The resonator gyroscope assembly of claim 1, wherein the first vibration mode and second vibration mode are flexural vibration modes.

8. The resonator gyroscope assembly of claim 1, wherein the square resonator body is suspended adjacent to the substrate by a suspension support in communication with the substrate.

9. The resonator gyroscope assembly of claim 7, wherein the suspension supports support a portion of the drive electrode and the sense electrode.

10. A resonator gyroscope assembly comprising:
a resonator body suspended adjacent to a substrate;
a ground electrode attached to a side of the resonator body;
a piezoelectric layer attached to a side of the ground electrode;
a drive electrode in electrical communication with the piezoelectric layer, and configured to detect a first vibration mode of the resonator body;
a sense electrode in electrical communication with the piezoelectric layer, and configured to receive an output from the resonator body responsive to stimulation of a second vibration mode of the resonator body; and
a drive-tuning electrode in electrical communication with the piezoelectric layer, and configured to match a resonant frequency of the first vibration mode of the resonator body and a resonant frequency of the second vibration mode of the resonator body.

11. The resonator gyroscope assembly of claim 10, wherein the piezoelectric material is composed of a material selected from the group comprising: AlN, ZnO, PZT, GaN, LiNb03, and mixtures thereof.

12. The resonator gyroscope assembly of claim 10, wherein the resonator body comprises a disk resonator body.

13. The resonator gyroscope assembly of claim 10, wherein an alternating current signal is applied to the tuning electrode.

14. The resonator gyroscope assembly of claim 10, wherein the first vibration mode and second vibration mode are mutually orthogonal.

15. The resonator gyroscope assembly of claim 10, wherein the first vibration mode and second vibration mode are degenerate vibration modes.

16. The resonator gyroscope assembly of claim 10, wherein the first vibration mode and second vibration mode are flexural vibration modes.

17. The resonator gyroscope assembly of claim 10, wherein the resonator body is suspended adjacent to the substrate by a suspension support in communication with the substrate.

18. The resonator gyroscope assembly of claim 10, wherein the resonator body and suspension supports are fabricated from the substrate.

19. The resonator gyroscope assembly of claim 10, further comprising a linear tuning circuit configured to:
receive a drive input signal corresponding to the displacement of a drive electrode,
produce an output signal corresponding to an integration of the drive input signal multiplied by a scale factor, and
apply the output signal to the drive-tuning electrode.

20. The resonator gyroscope assembly of claim 10, further comprising a lock-in amplifier, having a sense channel, and a drive channel,
wherein the sense channel is configured to receive a sense input signal from the sense electrode corresponding to the displacement of the sense electrode, and is configured to output a signal proportional to the rate of rotation of the gyroscope, and
wherein the drive channel is configured to receive the drive input signal, and is configured to produce a drive output a signal corresponding to a resonant frequency of the resonator body, and is configured to apply the drive output signal to adrive-stimulating electrode.

21. Method for making a gyroscope resonator comprising:
patterning a drive electrode and a sense electrode on a first side of the substrate,
wherein the substrate comprises a first conductive layer and second conductive layer separated by piezoelectric layer attached to a first semiconductor layer and a second semiconductor layer separated by an insulator layer, and
wherein the patterning removes a portion of the first conductive layer,
patterning a resonator body by removing a portion of the first conductive layer, piezoelectric layer, second conductive layer, and substrate to define a shape of a resonator; and
releasing the resonator body by removing a portion of the second conductor layer and the insulator layer of the substrate disposed approximately adjacent to the resonator body,
wherein the resonator body is composed of a material selected from a group comprising: fused quartz, polysilicon, silicon oxide, monocrystalline silicon, metallic materials, GaAs, silicon carbide, diamond, and mixtures thereof.

22. The method of claim 21, wherein the piezoelectric layer comprises one or more of AlN, ZnO, PZT, GaN, and LiNb03.

23. The method of claim 21, wherein the resonator body is a square resonator body.

24. The method of claim 21, further comprising the step of patterning a drive-tuning electrode onto the first side of the substrate, wherein the patterning removes a portion of the first conductive layer.

25. The method of claim 21, wherein patterning the resonator body further comprises removing a portion of the first conductive layer and the substrate defining a shape of a suspension support in communication with the substrate and the resonator body.

26. The method of claim 21, wherein a portion of an electrode is supported by the suspension supports.

27. A method of operating a piezoelectric gyroscope, comprising:
   receiving a drive input signal corresponding to a displacement of a drive electrode;
   generating an output signal corresponding to an integration of the drive input signal multiplied by a scale factor; and
   applying the output signal to a drive-tuning electrode.

28. The method of claim 27, further comprising:
   receiving a sense input signal corresponding to a displacement of a sense electrode,
   generating a rotation rate output signal proportional to a rate of rotation of the gyroscope.

29. The method of claim 27, further comprising:
   receiving a drive input signal,
   generating a drive output signal corresponding to a resonant frequency of a resonator body, and
   applying the drive output signal to a drive stimulating electrode.

* * * * *

UNITED STATES PATENT AND TRADEMARK OFFICE
CERTIFICATE OF CORRECTION

PATENT NO. : 9,917,571 B2  
APPLICATION NO. : 14/739721  
DATED : March 13, 2018  
INVENTOR(S) : Farrokh Ayazi et al.

Page 1 of 1

It is certified that error appears in the above-identified patent and that said Letters Patent is hereby corrected as shown below:

In the Claims

In Column 15, Line 19 (Claim 4), "configured minimize" should read -- configured to minimize --
In Column 16, Line 33 (Claim 20), "output a signal" should read -- output signal --
In Column 16, Line 35 (Claim 20), "adrive-stimulating electrode" should read -- a drive-stimulating electrode --

Signed and Sealed this
First Day of May, 2018

Andrei Iancu
*Director of the United States Patent and Trademark Office*